United States Patent [19]
Suzuki et al.

[11] 3,958,187
[45] May 18, 1976

[54] CLOCK SIGNAL GENERATING DEVICE WITH COMPLEMENTARY MOS TRANSISTORS

[75] Inventors: Yasoji Suzuki, Ayase; Teruaki Tanaka, Yokohama, both of Japan

[73] Assignee: Tokyo Shibaura Electric Co., Ltd., Kawasaki, Japan

[22] Filed: May 19, 1975

[21] Appl. No.: 578,985

[30] Foreign Application Priority Data
May 20, 1974 Japan.................. 49-55360

[52] U.S. Cl.................. 331/74; 58/23 A; 307/221 C; 307/303; 307/304; 331/108 D; 331/116 R
[51] Int. Cl.².................. H03B 5/36; H03K 23/30
[58] Field of Search........ 331/116 R, 108 C, 108 D, 331/74; 307/303, 304, 221 C; 58/23 R, 23 A, 23 AC; 357/42

[56] References Cited
UNITED STATES PATENTS
3,664,118  5/1972  Walton.................. 331/116 R X
3,757,510  9/1973  Dill.................. 331/116 R X

*Primary Examiner*—Siegfried H. Grimm
*Attorney, Agent, or Firm*—Finnegan, Henderson, Farabow & Garrett

[57] ABSTRACT

Disclosed is a clock signal generating integrated circuit device comprising a quartz crystal oscillator section and a multistage frequency divider section. The crystal oscillator section and each frequency divider stage includes respectively complementary insulated gate field effect transistors. According to the present invention, the high frequency-operated field effect transistors have a lower threshold voltage than the remaining field effect transistors, so that the occupied area of the oscillator section can be decreased and simultaneously the power dissipation can also be reduced.

4 Claims, 5 Drawing Figures

CLOCK SIGNAL GENERATING DEVICE WITH COMPLEMENTARY MOS TRANSISTORS

This invention relates to a clock signal generating device comprising a quartz crystal-controlled oscillator section and a multistage frequency divider section connected to the crystal-controlled oscillator section which are formed of integrated MOS field effect transistors.

In recent years, a clock signal generating integrated circuit device comprising a crystal-controlled oscillator circuit and a multistage frequency divider circuit has been widely used in a field of battery-powered wrist watch with a digital or analogue display.

For example, a mechanically regulated battery-powered wrist watch comprises, as shown in FIG. 1, a complementary MOS transistor integrated circuit (C-MOS-.IC) 10 comprised of an oscillator circuit section 11 controlled by a crystal oscillating element 12, a multistage frequency divider circuit 13 and a buffer 14. An operating voltage is applied by a battery 15 to the oscillator circuit 11, frequency divider circuit 13 and buffer 14. The multistage frequency divider circuit 13 operates to divide sequentially the master standard frequency from the oscillator circuit section 11 up to a timekeeping rate of, for example, one second. A timing signal having a cyclic period of one second is given through the buffer 14 to an actuator 16 having pulse motor means for driving an analogue time display 17 having an hour hand, a minute hand and a second hand. In the above-mentioned electronic timekeeping device, it becomes a problem how the total amount of current dissipation or power dissipation in the MOS integrated circuit should be decreased to maintain the battery life for one or more years. Particularly, the total amount of current dissipation largely depends upon the oscillating frequency, and the higher the frequency, the larger the amount of current dissipation. For this reason, the power dissipation in the crystal oscillator circuit, or the power dissipation in the high frequency stage or stages of the frequency divider circuit as well as that in the crystal oscillator circuit raises a problem.

For the above-mentioned reasons, in the prior art electronic timekeeping device, attempt is made to reduce the power dissipation by using a crystal oscillating element for a low frequency of, for example, 32 KHz. The use of this kind of crystal oscillating element, however, poses the following problem.

Since the stability and accuracy as of a timepiece greatly depend upon the oscillating frequency and the higher the latter, the higher the former also, the employment of the low frequency-crystal oscillating element results in a low stability and accuracy. Further, since such crystal oscillating element has no wide availability, it is costly. In order to solve these problems, it is preferable to use a high frequency-crystal oscillating element (having a frequency of, for example, about 4 MHz) which can be employed in a field of high frequency, e.g., in an arena of television. In this case, however, the total amount of current dissipation for the integrated circuit is increased, as evident from the foregoing description.

In this way, the stability and accuracy as of a timepiece are in contrary relation to the battery life with respect to the oscillating frequency, and in the prior art there is no means for satisfying both at the same time, so that either of both falls a victim of the other.

It is accordingly the object of the invention to provide a clock signal generating device comprised of complementary insulated field effect transistors, which is capable of improving the stability and accuracy of a timepiece using a high frequency-quartz crystal oscillating element and in which the power dissipation is small.

The clock signal generating device according to the invention is characterized in that the the complementary insulated field effect transistors adapted for high frequency operation have a lower threshold voltage than the complementary insulated field effect transistors adapted for low frequency operation.

This invention can be more fully understood from the following detailed description when taken in conjunction with the accompanying drawings, in which.

Figure 2:
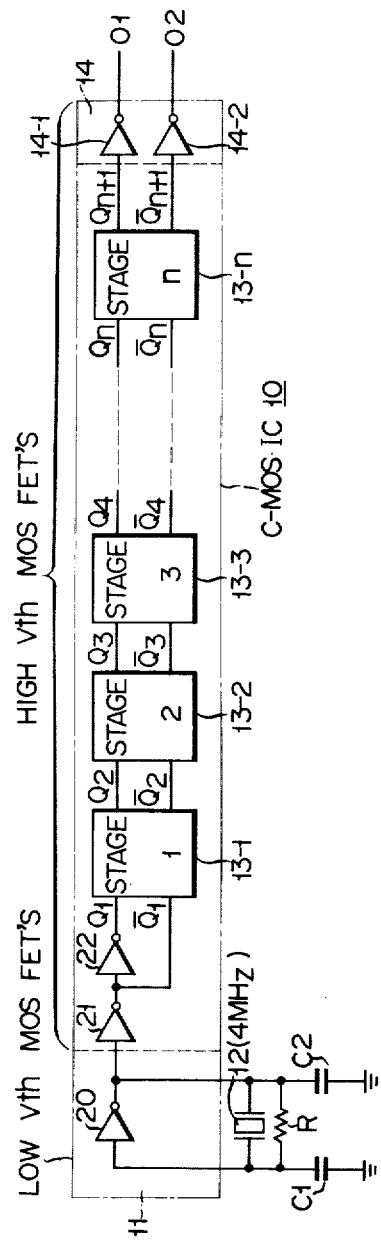
FIG. 2 is a block diagram illustrating a clock signal generating MOS transistor integrated circuit according to an embodiment of the invention having a crystal-controlled oscillator section comprised of complementary MOS transistors having low threshold voltage and a frequency divider section comprised of complementary MOS transistors having high threshold voltage.

The circuit arrangement of a clock signal generating device according to the invention is completely the same as that of a prior art clock signal generating device, excepting that for the reasons as later described in detail the threshold voltage of high frequency-complementary MOS transistors is different from that of low frequency-complementary MOS transistors, namely, the former is lower than the latter. In FIG. 2 illustrating an embodiment of the invention, therefore, illustration is made such that the complementary transistors constituting an oscillator circuit section 11 have a low threshold voltage while the remaining transistors have a high threshold voltage.

Figure 3:
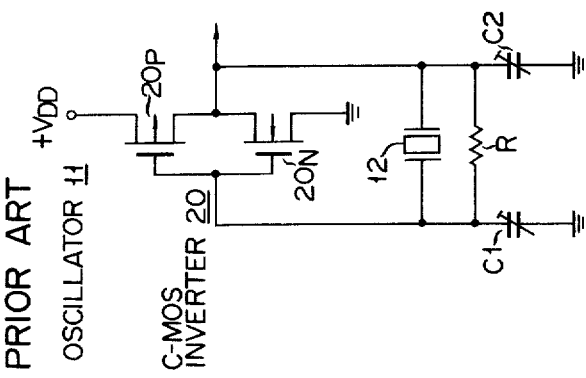
FIG. 3 illustrates a prior art crystal-controlled oscillator circuit including a complementary MOS transistor inverter.
Figure 1:
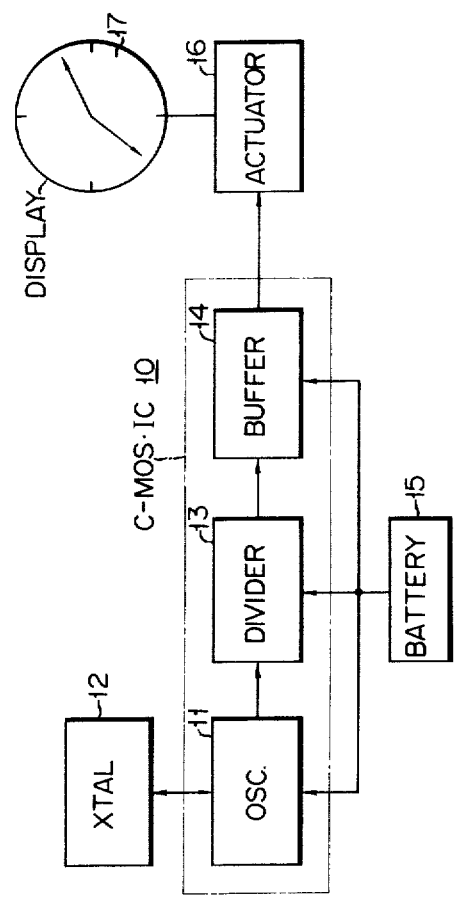
FIG. 1 is a block diagram schematically illustrating a prior art mechanically regulated battery-operated wrist watch.

The oscillator circuit section 11, as illustrated in FIG. 3, comprises a complementary MOS transistor inverter 20 composed of a P-channel MOS transistor 20P and N-channel MOS transistor 20N. Between the input, or commonly connected gates, and the output, or commonly connected drains, of the inverter 20 are connected a crystal oscillating element 12 capable of oscillating at a frequency of about 4 MHz (exactly 4.194304 MHz) and a feedback resistor R. The input and output of the inverter 20 are connected to ground through frequency adjusting capacitors $C_1$ and $C_2$, respectively.

Turning back to FIG. 2, the standard frequency signal from the crystal-controlled oscillator circuit section 11 is supplied to inverters 21 and 22 each comprised of complementary MOS transistors to produce the complementary signals $Q_1$ and $\overline{Q}_1$ of the standard frequency signal.

The multistage frequency divider circuit section 13 comprises cascade-connected binary counters 13-1, 13-2, . . . 13-n provided in a number of n. Each binary counter operates so as to produce complementary output clock signals the frequency of each of which is half the input frequency, in response to the complementary input clock signals.

If, in case the standard frequency is 4.194304 MHz, n=22, the complementary outputs $Q_{n+1}$ and $\overline{Q}_{n+1}$ of the nth stage binary counter 13-n will have a cyclic period of one second. The outputs $Q_{n+1}$ and $\overline{Q}_{n+1}$ having a frequency of one hertz are fed as driving pulses $O_1$ and $O_2$ to the actuator 16 through buffer complementary MOS inverters 14-1 and 14-2, respectively.

As the binary counter constituting the frequency divider circuit section 13 there can be used such binary counters as disclosed in the copending application Ser. No. 333,145 filed Feb. 26, 1973.

Figure 4:
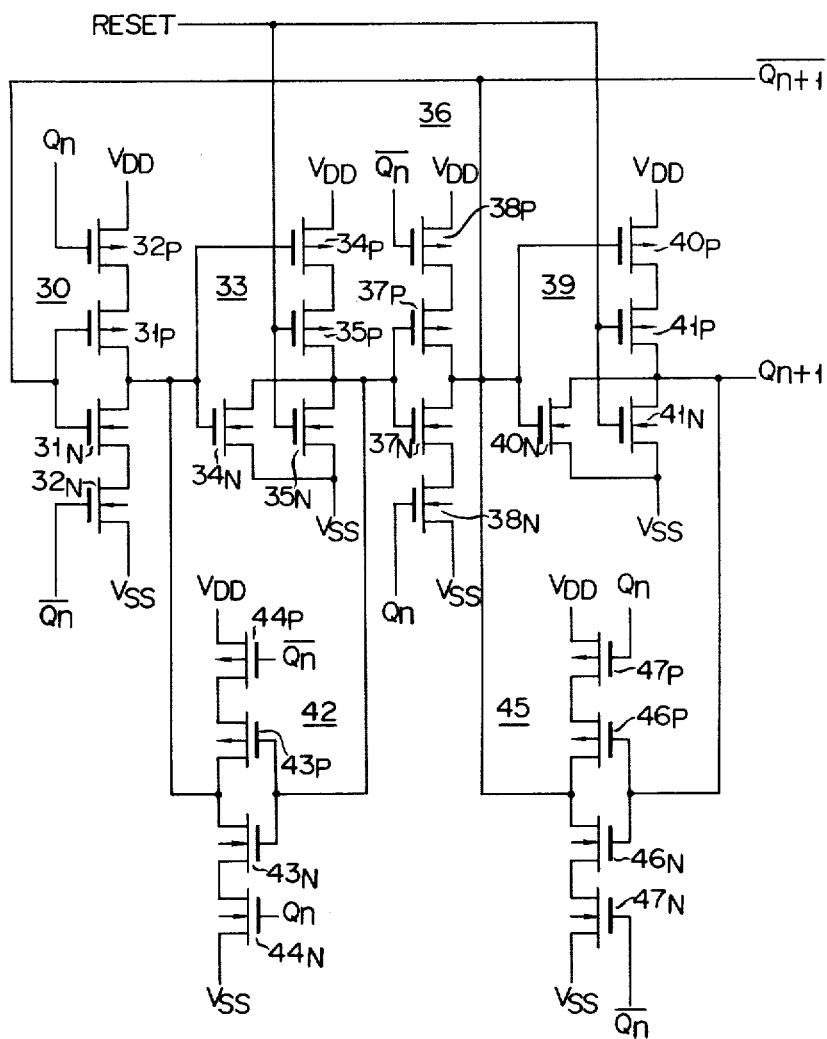
FIG. 4 illustrates a prior art static binary counter with a reset terminal which may be used in the low frequency stages of a multistage frequency divider section.

FIG. 4 illustrates an example of such binary counter. The illustrated binary counter is of a static type having a time correcting reset terminal and may be used in the seventh or eithth, or the succeeding frequency divider stages. A dynamic binary counter may be used in the high frequency stages.

In FIG. 4, a first clocked inverter 30 comprises complementary inverting MOS devices 31P, 31N and complementary swithcing MOS devices 32P, 32N. A first NOR gate 33 comprises complementary inverting MOS devices 34P, 34N and a normally conducting P-channel MOS device 35P and a normally non-conducting N-channel MOS device 35N. A second clocked inverter 36 comprises complementary inverting MOS devices 37P, 37N and complementary switching MOS devices 38P, 38N. A second NOR gate 39 comprises complementary inverting MOS devices 40P, 40N and a normally conducting P-channel MOS device 41P and a normally nonconducting MOS device 41N. A third clocked inverter 42 comprises complementary inverting MOS devices 43P, 43N and complementary switching MOS devices 44P, 44N. And finally, a fourth clocked inverter 45 comprises complementary inverting MOS devices 46P, 46N and complementary switching MOS devices 47P, 47N. The abovementioned first and second clocked inverters 30 and 36 are alternately operated in response to the complementary outputs $Q_n$ and $\overline{Q}_n$ of the preceding stage, while the above-mentioned fourth and third clocked inverters 45 and 42 are operated simultaneously with the above-mentioned first and second clocked inverters 30 and 36, respectively.

The dynamic binary counter does not require the third and fourth clocked inverters 42, 45 and the second NOR gate 39, and permits the omission of the MOS devices 35P and 35N of the first NOR gate 33.

In the present invention, the binary counter as constituting each frequency divider circuit state is not limited to the one comprising that clocked inverter as illustrated in FIG. 4 wherein the drain-to-source paths of the switching and inverting MOS devices are connected in series to each other, but another prior art binary counter may also be used which comprises basic complementary MOS inverters and transmission gates each consisting of complementary MOS devices connected in source-to-source and drain-to-drain configuration. The present inventors have conducted various designs and analyses on the foregoing C-MOS.IC. Hereinafter, these are explained. When it is now assumed, on the premise that the crystal oscillator circuit employed takes such a π configuration as illustrated in FIG. 3, that the loop gain be greater than unity, the phase shift be $2n\pi$, the attenuation of the feedback path be represented by $\beta$, the fundamental phase shift of the feedback path be $\pi$, the following equation is obtained in accordance with the Barkhausen's condition, as disclosed in Digital Integrated Circuits, Application Note ICAN-6539 "Micropower Crystal Controlled Oscillator Design Using RCA COS/MOS Inverters" by S. S. Eator, published by RCA Corporation in 1972.

$$|\beta|_{\phi=\pi} = \frac{X_{ein}}{X_L(\text{eff})} \cdot \frac{1}{KA} \tag{1}$$

where $$KA = 1 + \left(\frac{R_o}{X_{eo}}\right)\left(\frac{R_e}{X_L(\text{eff})}\right)$$

$$X_L(\text{eff}) = X_e - X_{ein}$$

where $R_o$ represents the output impedance of the amplifier (C-MOS inverter 20), $R_e$ the equivalent resistance of the crystal oscillating element, $X_{eo}$ the external output reactance, $X_L$ (eff) the input reactance as viewed from the output side, $X_e$ the equivalent reactance of the crystal oscillating element, and $X_{ein}$ the external input reactance.

The oscillation stability $S_F$ can be expressed as the following ratio of the value to the maximum value of a ratio of a deviation $\Delta\phi$ from the phase shift 180°C ($=\pi$) of the feedback path to $X_e$. That is, $$S_F = \frac{d(\Delta\phi)}{dX_e} / \left[\frac{d(\Delta\phi)}{dX_e}\right]_{max} \tag{2}$$

Further, if the amount of attenuation $\beta$ of the feedback path is 0.75 in terms of its absolute value, the $S_F$ will be satisfied. Similarly, the value of $\Delta\phi$ is typically smaller than 5°, and if, therefore, it is estimated with respect to a frequency of lower than 2.5 MHz that $\Delta\phi = 15°$, it can be said to be a stable value.

Accordingly, upon designing the 4 MHz crystal oscillator circuit, determination is made such that $|\beta| = 0.75$ (provided that $\phi = \pi$), and $S_F = 0.75$ on the assumption that $\Delta\phi = 20°$ at maximum (this is because the higher the frequency, the greater the value of $\Delta\phi$). Under these conditions, the above-mentioned equation (1) is rewritten as follows.

$$KA = \frac{4 \cdot X_{eL} + 1.216 \cdot R_e}{X_{eL} - 1.216 \cdot R_e \cdot |\beta|_{(\phi-\pi)}} \tag{3}$$

where $$X_{eL} = (2\pi f_{osc} C_L)^{-1}$$

Assume now that the maximum equivalent impedance of the 4 MHz crystal oscillating element $R_e = 100$ ($\omega$), $|\beta| = 0.75$, and $X_{eL} = 2.92 \times 10^3$ ($\omega$), then KA will be determined from the equation (3) as follows.

$$KA = 4.171$$

$$X_L(\text{eff}) = \frac{X_{eL}}{1 + KA \cdot |\beta|_{(\phi-\pi)}} = 7.072 \times 10^2 \ (\Omega)$$

-continued $$X_{ru} = X_L(\text{eff}) \cdot |\beta|_{(\phi = \pi)} \cdot KA$$

$$= 2.212 \times 10^3 \, (\omega)$$

$$X_{ru} = 0.708 \times 10^3 \, (\omega)$$

Therefore, $R_0$ is determined as follows.

$$R_0 = \frac{(KA - 1) \cdot X_{ru} \cdot X_L(\text{eff})}{R_r}$$

$$= 15.87 \times 10^3 \, (\omega) \tag{4}$$

Considering now that a battery of 3 volts is used and the power source voltage level may be reduced to 2.5 volts due to the attenuation and thus the power source potential $V_{DD}$ min is 2.5 volts, it is considered that $V_{DD}$ min $\geq |VthP| + VthN$. Therefore, Vth max $\doteq 1.2$ volts. In this case, the Vth represents threshold voltage, the Vth P the threshold voltage of a P channel MOS device, and the VthN the threshold voltage of an N channel MOS device. Suppose now that the variation in Vth in manufacturing be 0.6 volts, then Vth = 0.6 to 1.2 volts. Considering that $R_0$ is the reciprocal of the transfer conductance gm, the size W/L of a MOS device employed in the C-MOS inverter 20 of the 4 MHz crystal oscillator circuit is expressed approximately as follows.

$$\frac{W}{L} = \frac{t_{ox}}{\mu \, \epsilon_{ox} (V_G - Vth)} \cdot \frac{1}{R_0} \tag{5}$$

where W represents the channel width, L the channel length, $t_{ox}$ the gate oxide film thickness 1300Å, $\mu$ the mobility ($\mu p = 130 \, V_s/\text{cm}, \mu N = 230 \, V_s/\text{cm}$), $\epsilon_{ox}$ the dielectric constant of the silicon oxide film-34.5 × $10^{-12}$(F/m), and $V_G$ the gate voltage. Substituting $R_0 = 15.87$ (K$\omega$) determined from the equation (4) into the above equation (5), W/L $\doteq 14.05$. Therefore, when it is assumed that L = 7$\mu$, W = 100$\mu$ Accordingly, if manufacture is made of the C-MOS inverter 20 having a channel width of 100$\mu$, a 4 MHz oscillating operation will be possible. Actually, however, when the crystal oscillation element is loaded upon the C-MOS inverter and is caused to make a $\pi$-form self-oscillation, there is a fear that a voltage induced due to, for example, thermal noises of the crystal oscillating element, i.e., the self-oscillation starting voltage $V_{DD}$ (start), if, in case Vth = 1.2 volts, would not cause oscillation under the condition of $V_{DD}$ min = 2.5 volts. Namely, since $V_{DD}$ min $\neq V_{DD}$ (start), there is a possibility that no oscillation occurs. Accordingly, to make $V_{DD}$ (start) equal to $V_{DD}$ min, it is necessary either that the channel width is increased (for instance, up to 150$\mu$) and yet the transfer conductance gm is also increased, or that the variation in Vth is decreased with the channel width unchanged. For example, when W = 150$\mu$, the $V_{DD}$ start = 2.3 volts. But where, in this way, W and gm are increased, the occupied area of the oscillator circuit is enlarged and the total amount of current dissipation $I_{DD}$ is increased and the battery life of the timepiece is shortened.

Further, when the variation in Vth is made small, the manufacturing margin is lowered to decrease the manufacturing yield, leading to an increse in the manufacturing cost. Let's determine now the oscillation starting voltage $V_{DD}$ (start). When the high frequency oscillation is effected, it is considered that $V_{DD} - |VthP| <$ the output voltage $V_0$ of the C-MOS inverter 20 $\leq V_{DD}$, and the input voltage of the C-MOS inverter 20 $>$ VthN. Therefore, the N channel MOs device can be regarded as being in the region of non-saturated operation. When it is assumed that $V_0 = V_{DD}$, the drain current $I_N$ of the N channel MOS device can be expressed by the equation:

$$I_N \simeq \beta_N \{(V_{DD} - VthN) \cdot V_{DD} - \tfrac{1}{2} V_{DD}^2\} \tag{6}$$

Similarly, when it is assumed that $V_0 = 0$, the drain current $I_P$ of the P channel MOS device can be expressed as follows.

$$I_P \simeq \beta_P \{(0 - V_{DD}' + |VthP|)(-V_{DD}') - \tfrac{1}{2} V_{DD}'^2\} \tag{7}$$

The output impedance $R_0$ of the above-mentioned C-MOS inverter 20 is related as follows.

$$V_{DD} = R_0 \cdot I_N, \quad V_{DD}' = R_0 \cdot I_P \tag{8}$$

From the equations (6), (7) and (8), the followings are obtained.

$$I_N \simeq \beta_N \cdot \frac{V_{DD}}{2} (V_{DD} - 2VthN) = \frac{V_{DD}}{R_0} \tag{9}$$

$$I_P \simeq \beta_P \cdot \frac{V_{DD}'}{2} (V_{DD}' - 2|VthP|) = \frac{V_{DD}'}{R_0} \tag{10}$$

Accordingly, from the equations (9) and (10) the $V_{DD}$ and $V_{DD}'$ are expressed as follows.

$$V_{DD} = 2\left(|VthN| + \frac{1}{R_0 \beta_N}\right)$$

$$V_{DD}' = 2\left(|VthP| + \frac{1}{R_0 \beta_P}\right)$$

considering here that $$V_{DD} = \frac{V_{DD} + V_{DD}'}{2},$$

$$V_{DD} = |VthP| + VthN + \frac{1}{R_0}\left(\frac{1}{\beta_P} + \frac{1}{\beta_N}\right) \tag{11}$$

The self-oscillation starting voltage $V_{DD}$ (start), using the equation (11), is given as below.

$$V_{DD} \text{ (start)} \cong n\left[|VthP| + VthN + \frac{1}{R_0}\left(\frac{1}{\beta_P} + \frac{1}{\beta_N}\right)\right] \tag{12}$$

where $n$ is given as 0.5 from the actual measurement.

To determine the $V_{DD}$ (start) in the cases where W = 100$\mu$ and where W = 150$\mu$, using the equation (12), the results are presented as in Table 1.

Table 1

| W ($\mu$) | Vth(V) | | |
|---|---|---|---|
| | 0.6 | 0.9 | 1.20 |
| 100 | 2.03 V | 2.33 V | 2.63 V |

Table 1-continued

| W (μ) | Vth(V) 0.6 | 0.9 | 1.20 |
|---|---|---|---|
| 150 | 1.55 V | 1.85 V | 2.15 |

As seen from Table 1, when Vth = 0.6(V) − 1.2(V) (variation is 0.6(V)), the $V_{DD}$ start is 2.63 volts in case of W = 100μ. Namely, the requirement of $V_{DD}$ min = 2.5 volts is not satisfied. Accordingly, in order to meet this requirement, it becomes necessary that W = 150μ. At this time, however, it will be understood that there is a problem as to both the power and the occupied area.

Here, if, in case the VthP and VthN have the same value and the $β_P$ and $β_N$ of the MOS devices are approximately the same, the oscillating wave-form is a sine wave, the power will be given by $P = I_{av}$ (the average current of the sine wave). $V_{DD}$, and the $I_{av}$ will be expressed as follows.

$$I_{av} = \frac{2}{\pi} \beta V_{DD}^2 \tan \theta (\theta \sin 2\theta + \cos 2\theta - 2\cos \theta + 1)$$

where $$\theta = \sin^{-1} \frac{V_{DD} - 2Vth}{V_{DD}}$$

Accordingly, to determine the $I_{av}$ using the Vth, the results are shown in Table 2.

Table 2

| W(μ) | Vth(V) 0.6 | 0.9 | 1.20 |
|---|---|---|---|
| 100 | 62.25 (μA) | 17.74 (μA) | 10.65 (μA) |
| 150 | 110.66 (μA) | 31.39 (μA) | 18.84 (μA) |

As seen from Table 2, if, in case the Vth = 0.6V, W = 150μ, a power increase of approximately 50% will result and the occupied area will become 1.5 times larger.

In accordance with the foregoing analyses, this invention is so arranged that the Vth of the MOS devices of the crystal oscillator circuit involved in the semiconductor integrated circuit device (C-MOS.IC) is different from the Vth of the MOS devices of the remaining circuits. As an example, determination is made such that W = 100μ and Vth = 0.3V ~ 0.9V. To determine the $V_{DD}$ (start) and $I_{av}$ in this case, the results are presented as in Table 3.

Table 3

| W(μ) | Vth(V) 0.3 | 0.9 |
|---|---|---|
| 100μ | $V_{DD}$ (start) 1.73 V | $V_{DD}$ (start) 2.33 V |
|  | $I_{av}$ 157.04 μA | $I_{av}$ 17.74 μA |

Note here that in a usual electronic watch a 3 volt-battery can be used with a current $I_{av}$ of nearly 150 μA for 1.5 to 2 years.

Accordingly, the minimum value of $V_{DD}$ can be made smaller without making the $I_{av}$ value larger.

For the foregoing reasons, if, as illustrated in FIG. 2, the Vth of the MOS devices of the crystal oscillator circuit is made low (for example, 0.3 to 0.9 volts as mentioned above) and the Vth of the MOS devices of the frequency divider circuit high (for example, 0.6 to 1.2 volts) by means of the ion implantation technique, a C-MOS.IC which is small in the occupied area will be realized. That is, where it is desired to make the Vth of the MOS FET's low, a small amount of boron has only to be implanted into the channel region using the ion implantation method. Alternatively, a decrease in level of the above Vth can be achieved by reducing the gate oxide film in thickness or by substituting for the aluminium gate electrode a gate electrode formed of polycrystal material having a small work function such as polysilicon, molybdenum or the like.

As above described, according to the invention, a semiconductor integrated circuit device which is small in power dissipation can be obtained without enlarging the occupied area of the crystal oscillator circuit.

Further, if the electronic watch construction is made by using the above-mentioned semiconductor integrated circuit device, there can be provided an inexpensive electronic watch which is excellent in stability and accuracy and long in battery life.

Figure 5:
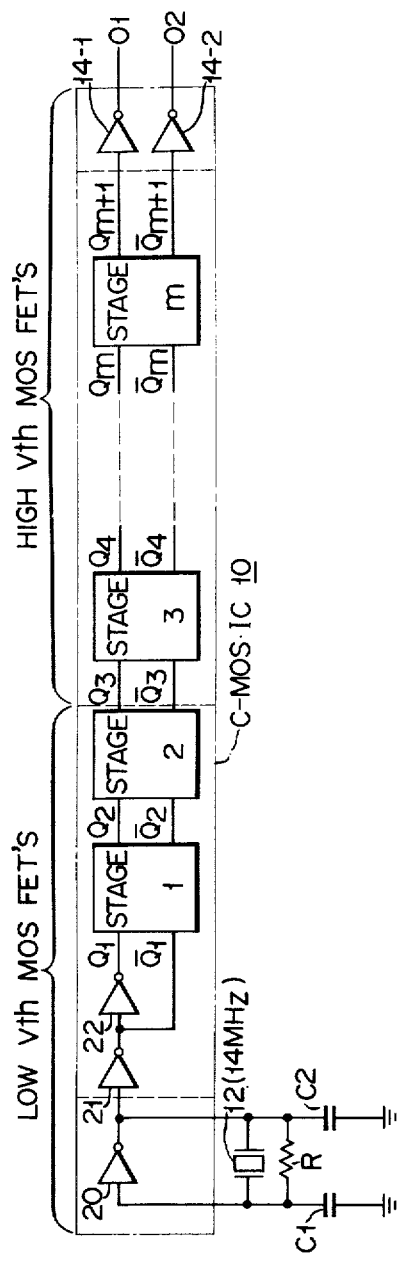
FIG. 5 is a block diagram illustrating a clock signal generating MOS transistor integrated circuit according to another embodiment of the invention.

This invention is not limited to the 4 MHz oscillation which has been described above as an example, but can of course be applied to an oscillation of 250 KHz, 14 MHz, etc. Further, in the above example, arrangement is so made that the threshold voltage of the oscillator circuit alone is lower than that of the remaining circuits, but in case of 14 MHz the first, or first and second stages of the frequency divider circuit adapted for high frequency operation as well as the oscillator circuit may be arranged to have a lower threshold voltage as illustrated in FIG. 5.

What we claim is:

1. A clock signal generating device comprising a crystal oscillator circuit means having a crystal oscillating element and complementary field effect transistors connected to said crystal oscillating element, for generating a standard frequency, and a multistage frequency divider circuit means which is conected to said crystal oscillator circuit means and operative to divide the standard frequency and formed of complementary field effect transistors; characterized in that the complementary field effect transistors included in said clock signal generating device which are adapted for high frequency operation have a lower threshold voltage than those adapted for low frequency operation.

2. A clock signal generating device according to claim 1, characterized in that the complementary field effect transistors adapted for high frequency operation are included in said crystal oscillator circuit means.

3. A clock signal generating device according to claim 1, characterized in that the complementary field effect transistors adapted for high frequency operation are included in said crystal oscillator circuit means and at least the first stage of said multistage frequency divider circuit means.

4. A clock signal generating integrated circuit comprising a quartz crystal oscillator circuit section having complementary field effect transistors for generating a standard frequency, and a multistage frequency divider circuit section which is coupled to said quartz crystal oscillator circuit section and each stage of which is so operative in response to complementary input clock signals as to produce complementary clock signals the frequency of which is half the frequency of the complementary input clock signals and is formed of complementary field effect transistors, characterized in that the complementary field effect transistors included in said crystal oscillator circuit section have a lower threshold voltage than the complementary field effect transistors included in a plurality of stages of said multistage frequency circuit section which are adapted to operate at low frequencies.

* * * * *